United States Patent [19]

Colombier et al.

[11] Patent Number: 5,100,737
[45] Date of Patent: Mar. 31, 1992

[54] MULTI-LAYER MATERIAL COMPRISING FLEXIBLE GRAPHITE WHICH IS REINFORCED MECHANICALLY, ELECTRICALLY AND THERMALLY BY A METAL AND A PROCESS FOR THE PRODUCTION THEREOF

[75] Inventors: Gabriel Colombier, St. Egreve; Philippe Gimenez, Echirolles; Claude Drapier, Vaucresson; Michel Moreau, Clichy, all of France

[73] Assignee: Le Carbone Lorraine, Courbevoie, France

[21] Appl. No.: 610,139

[22] Filed: Nov. 7, 1990

[30] Foreign Application Priority Data

Nov. 16, 1989 [FR] France .................. 89 15741

[51] Int. Cl.⁵ ............................................. B32B 15/04
[52] U.S. Cl. ..................................... 428/612; 428/408; 428/457; 428/614; 428/634; 428/621; 428/343; 428/344; 428/346
[58] Field of Search ............... 428/457, 408, 343, 344, 428/614, 621, 634, 612

[56] References Cited

U.S. PATENT DOCUMENTS

| | | | |
|---|---|---|---|
| 3,492,197 | 1/1970 | Olstowski et al. | 428/412 |
| 4,234,638 | 11/1980 | Yamagoe et al. | 428/408 X |
| 4,265,952 | 5/1981 | Caines | 428/457 X |
| 4,333,975 | 6/1982 | Booth | 428/408 X |
| 4,400,433 | 8/1983 | Ishiguro et al. | 428/408 |
| 4,455,334 | 6/1984 | Ogino et al. | 428/37 X |
| 4,504,527 | 3/1985 | Hara et al. | 428/469 X |
| 4,534,922 | 8/1985 | Atkinson et al. | 428/408 X |
| 4,591,520 | 5/1986 | Brodie | 428/428 X |
| 4,847,883 | 7/1989 | Fourre | 428/408 X |
| 4,852,645 | 8/1989 | Coulon et al. | 428/408 x |
| 4,888,242 | 12/1989 | Matsuo et al. | 428/337 X |
| 4,973,516 | 11/1990 | Yamaoka et al. | 428/408 X |

FOREIGN PATENT DOCUMENTS

155083 2/1985 European Pat. Off. .
3309338 3/1983 Fed. Rep. of Germany .

Primary Examiner—George F. Lesmes
Assistant Examiner—D. R. Zirker
Attorney, Agent, or Firm—Dennison, Meserole, Pollack & Scheiner

[57] ABSTRACT

A multi-layer material comprises at least two layers of flexible material, including one layer based on electrically conductive, expanded recompressed graphite and another layer based on a metal, wherein the layer of graphite has at least one face thereof covered at every point by a layer of metal and in direct electrical contact with the layer of metal, and wherein the layer of metal is obtained by electrodeposition or by chemical deposit of at least one metal on the layer of graphite in such a way that the layer of metal adheres directly to the layer of graphite and closely matches the micro-relief thereof.

16 Claims, 5 Drawing Sheets

MULTI-LAYER MATERIAL COMPRISING FLEXIBLE GRAPHITE WHICH IS REINFORCED MECHANICALLY, ELECTRICALLY AND THERMALLY BY A METAL AND A PROCESS FOR THE PRODUCTION THEREOF

FIELD OF THE INVENTION

The present invention concerns a flexible multi-layer material comprising expanded, recompressed graphite reinforced by a metal, which is intended either for the production of sealing members, or for protection from electromagnetic radiation, or for the production of heat sinks, and the process for the production thereof.

STATE OF THE ART

The attraction of expanded, recompressed graphite, commonly referred to as flexible graphite, is known in many uses and in particular as a material for a sealing member. However one of the problems involved in the use of that material is its low level of mechanical strength so that endeavours are made to reinforce flexible graphite by means of a layer of metal.

Thus, German patent No. 3 309 338 describes a multi-layer material for a sealing member comprising a central metal reinforcement in the form of a strip of steel or aluminium, and two layers of flexible graphite on respective sides of the metal reinforcement, each layer of graphite covering a face of the metal reinforcement and being secured thereto by means of a layer of adhesive.

Likewise European patent No. 155 083 describes a multi-layer strip for a sealing member comprising a central metal reinforcement formed by a strip of electroformed nickel or iron of small thickness, the connection between the reinforcement and the layers of flexible graphite being made by an adhesive or possibly by the use of a metal reinforcement apertured with holes in such a way that the two layers of flexible graphite which are self-sticking are in contact with each other at certain locations.

Thus, in accordance with the prior art, the connection between the layers of flexible graphite and the metal reinforcement strip is made either by an adhesive or by mechanical means. There are increasingly numerous uses which require materials affording a high level of chemical, thermal and dimensional stability, which are used under conditions of temperature, pressure, chemical corrosiveness or non-contamination such that the use of an adhesive must be limited, if it is not prohibited. In fact, adhesives are products which are capable of creep, or suffering degradation for example by chemical attack or thermally.

Moreover the use of a metal reinforcement with holes therethrough does not constitute a satisfactory solution to that problem, for three reasons:

it does not permit the adhesion between the layers of flexible graphite and the mechanical strength of the multi-layer strip to be varied independently of each other (the greater the number of holes, the higher the degree of adhesion between the layers of graphite but the lower the level of mechanical strength of the strip);

a joint produced from such a material is heterogenous in respect of thickness since locally there may or may not be a metal reinforcement thickness, which is not favourable in terms of a sealing effect; and it lends itself poorly to continuous production.

It is known moreover that the protection of electronic equipment from electromagnetic radiation involves the provision of continuous conductive walls, for example by applying coatings of the type consisting of conductive paints to the enclosures of plastics material or to the walls of a room to be protected, or by using seals or joints consisting of conductive elastomers at the locations of discontinuities which are constituted in particular by display screens. In that use, the effectiveness of the protection afforded, which is characterised by measurement of the degree of attenuation of waves in the course of passing through the shielding may be estimated on the basis of measurement of its electrical resistance since the absorption attenuation effect is proportional to the square root of the electrical conductivity of the layer. In practice, the "resistance per square unit" which symbolically represented by R☐ and which is equal to the quotient of resistivity by the thickness of the coating is currently used. Thus in the case of nickel-bearing paints which make it possible to achieve levels of attenuation effect of between 30 and 65 dB, the resistance per square unit is generally between 2000 and 400 m$\Omega$ respectively for a thickness of 25 $\mu$m.

Finally, the cooling of ceramic boards must have recourse to materials which simultaneously exhibit good thermal conductivity and a low coefficient of expansion. Such a compromise in respect of characteristics is achieved for example with a co-rolled copper-invar-copper material, although the rigidity thereof is not compatible with the fragility of the ceramic, so that there is generally a contact between the two materials which does not provide for good thermal transfer.

OBJECT OF THE INVENTION

A first object of the invention is a multi-layer material based on flexible graphite reinforced by a metal with a view to improving its mechanical strength and in certain cases reducing its electrical resistance or enhancing its thermal conductivity, which permits it to be used in particular for the production of seals with a reduced or even zero content of adhesive as economic materials for shielding in relation to electromagnetic radiation or as particular heat sinks.

A sheet of flexible graphite of 0.2 mm in thickness, which has a resistance per square unit of from 50 to 60 m$\Omega$, which, just from the electrical point of view, would be appropriate for shielding purposes, cannot be used for this application by virtue of its inadequate mechanical strength. In the same manner a thin sheet of copper which is 5 $\mu$m in thickness and whose resistance per square unit is 3.5 m$\Omega$ would be perfectly appropriate from the electrical point of view but the use thereof either directly on the inside wall of enclosures of plastics material or at the surface of a flexible film of plastics material is delicate to carry into effect or even burdensome. The association of two elements consisting of flexible graphite and a thin sheet of conducting metal, typically copper, then makes it possible simultaneously to achieve under economic conditions a low level of electrical resistance and a high degree of facility of handling.

The same flexible graphite-copper association also presents an array of attractive properties: good thermal conductivity, a low coefficient of expansion and a high degree of flexibility. That array of characteristics is particularly suitable for thermal transfer situations.

Another object of the invention is a process for the economic production of multi-layer materials based on flexible graphite which is reinforced by a metal.

DESCRIPTION OF THE INVENTION

According to the invention the multi-layer material is formed by at least two layers of flexible materials of which one, identified by the letter C in this description, is based on expanded, recompressed graphite while the other is a layer of metal, characterised in that at least one of the faces of the layer of material C based on electrically conductive flexible graphite is covered at all points on its surface by a layer of metal M and is in direct electrical contact with said layer of metal M, and that said layer of metal M is produced by electrodeposit or by chemical deposit of metal M on said layer of material C in such a way that the metal M directly to the layer of material C and closely matches the micro-relief thereof.

For the sake of convenience the same symbol will be used in this application to identify a material and the layer formed by said material.

According to the invention the material C is an electrically conductive flexible graphite which is known for example by the name PAPYEX, being a registered trademark (R) of the company LeCarbone Lorraine, of a specific gravity of between 0.3 and 1.5 and being of a thickness of between 0.1 and 10 mm, depending on the final use. That material is manufactured industrially and occurs in the form of a wound strip of great length and of a width which can exceed 1 m.

The metal M which is deposited on the layer of flexible material C is selected from metals which can be electrodeposited or which can be deposited by chemical means. If the final use requires good resistance to corrosion on the part of the metal M, nickel will preferably be selected while in the opposite case, other metals will equally be appropriate: copper, zinc, iron etc. Nickel is preferred in a sealing member use while copper which is a better electrical and thermal conductor will preferably be employed for electromagnetic shielding or heat sink uses.

The thickness of the layer of metal M is adapted either to the desired mechanical strength or to the desired electrical or thermal conductivity. It is generally between 1 and 200 mm and is preferably between 3 and 50 $\mu$m. For example, if there is a wish for a material having elevated mechanical characteristics, the thickness of the layer of metal M will be increased and conversely, the thickness of the layer of metal M will be chosen thin if flexibility of the multi-layer material is a priority consideration.

If the situation involves using the electrical characteristics of the multi-layer material for shielding purposes, it appears that a layer of copper of a few $\mu$m is sufficient to reduce the initial resistance of the flexible graphite so that it is superfluous, just from the electrical point of view, to deposit more than 5 $\mu$m of copper or more than 15 $\mu$m of nickel.

It is found that the adhesion of the metal M which is electro-deposited or deposited chemically on the layer of flexible material C is excellent and is superior to the internal cohesion of the layer C, at the usual specific gravities of the latter: the inter-layer adhesion of the multi-layer material M/C is greater than the internal cohesion of the material C (M/C represents the succession of the layers of materials along the axis which is perpendicular to the plane of the strip of multi-layer material and designates that strip of multi-layer material itself).

The multi-layer materials of type C/M or M/C/M can be used as they are as a material for sealing members, for electromagnetic shielding or for heat sink purposes, but in certain cases better results will be achieved with more complex multi-layer materials comprising a greater number of layers.

For that purpose, at least one of the two faces of a multi-layer material of type C/M or M/C/M is covered with a joining or bonding layer L of a thickness of between 1 and 10 $\mu$m, so as to be able to secure said face to another layer either of metal M or of flexible material C.

In accordance with a first embodiment of the invention the bonding layer L is formed by a metal LM having a melting point which is lower than that of the metal M serving as reinforcement, the layer of metal LM being deposited by any known means on at least one of the faces of the multi-layer materials C/M or M/C/M which were obtained previously so as to provide the following multi-layer materials: C/M/LM, LM/C/M, LM/C/M/LM, LM/M/C/M, LM/M/C/M/LM. The thickness of the layer of metal LM may be very small, between 1 and 5 $\mu$m, that layer not acting as a structural material intended to impart mechanical characteristics but only acting as a layer for bonding purposes or to provide protection from oxidation of the metal M.

The bonding metal LM is selected in dependence on the reinforcing metal M. If the latter is nickel or copper, the bonding metal used may be tin or a soft brazing alloy containing for example tin, lead or indium.

The multi-layer materials of which at least one of the faces is formed by bonding metal LM may also be used as they are as materials for seals, as materials for electromagnetic shielding or as a heat sink. Thus for example they can be applied to a metal support and they can be caused to adhere to the support by heating and a light pressure, which are applied for example by means of an ironing iron.

However, when using the material as a material for a sealing member in particular, the association of a plurality of layers of flexible material C may be desirable, in particular in order to provide a multi-layer material whose two external faces are of flexible material C, being a material which is chemically more inert than metals.

In order to illustrate some possible modes of association, the following multi-layer materials may be mentioned: C/M/LM/C, C/LM/C/M, C/LM/C/M/LM/C, C/LM/M/C/M, C/LM/M/C/M/LM/C, C/M/LM/M/C, C/M/LM/C/M/C, C/M/LM/C/M/LM/C, C/LM/C/M/LM, C/LM/M/C/LM.

Figure 4:
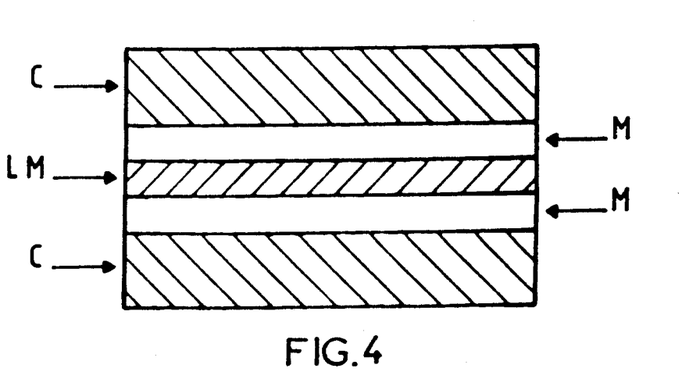
FIG. 4 shows a multi-layer material according to the invention: C/M/LM/M/C.

FIG. 4 illustrates the multi-layer material C/M/LM/M/C.

Figure 6:
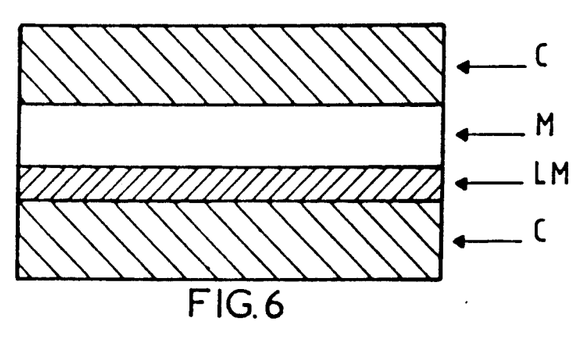
FIG. 6 shows a multi-layer material according to the invention: C/M/LM/C.

FIG. 6 illustrates the multi-layer material C/M/LM/C.

Figure 7:
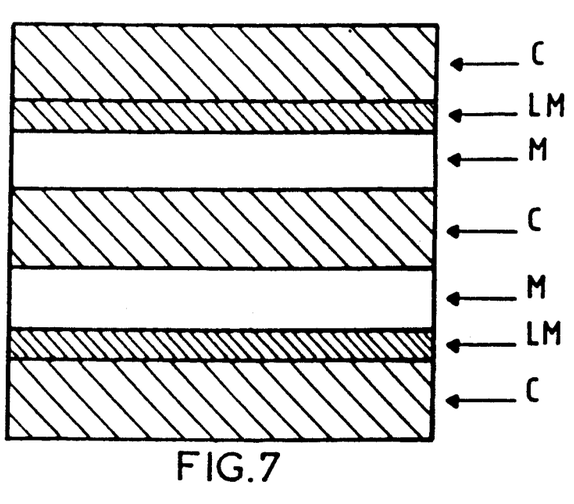
FIG. 7 shows a multi-layer material according to the invention: C/LM/M/C/M/LM/C.

FIG. 7 illustrates the multi-layer material C/LM/M/C/M/LM/C.

This first embodiment of the invention makes it possible to provide a multi-layer material which is totally free from thermolabile organic material.

In accordance with a second embodiment of the invention the bonding layer L is a layer of adhesive LA which is capable of causing adhesion of a layer of metal M and a layer of flexible material C. The adhesive LA is selected from known adhesives for adhering to carbon-bearing surfaces and to metals and alloys and is preferably based on phenol, epoxy, polyimide, acrylic and polyurethane resin. That thus provides the following multi-layer materials by the deposit of adhesive LA on at least one face of the multi-layer materials C/M or M/C/M: LA/C/M, C/M/LA, LA/C/M/LA, LA/M/C/M, LA/M/C/M/LA. The thickness of the layer is between 10 and 1 μm and will preferably be less than 5 μm.

Generally those multi-layer materials having at least one of the two faces covered with a layer of adhesive LA cannot be handled as such and are stuck to a layer of flexible material C which may be different from the initial layer of flexible material C in regard to thickness and/or specific gravity, to give the following multi-layer materials: C/LA/C/M, C/LA/M/C/M, C/LA/C/M/LA/C, C/LA/M/C/M/LA/C. However it is possible for the adhesive LA chosen to be an adhesive of the "hot-melt" type, that is to say an adhesive which can be applied hot and which after cooling gives a layer which is non-adhesive and therefore handleable but which can be reactivated by reheating. In that case the multi-layer materials having an external layer of adhesive LA can be handled and stored.

Figure 1:
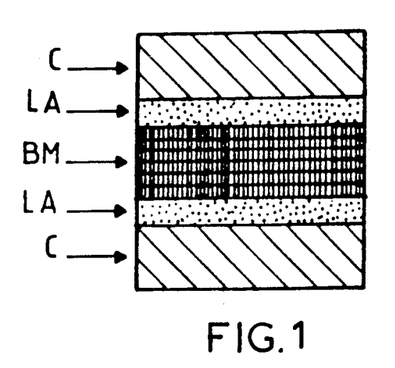
FIG. 1 diagrammatically illustrates the state of the art: C/LA/BM/LA/C in which BM denotes a metal strip.
Figure 2:
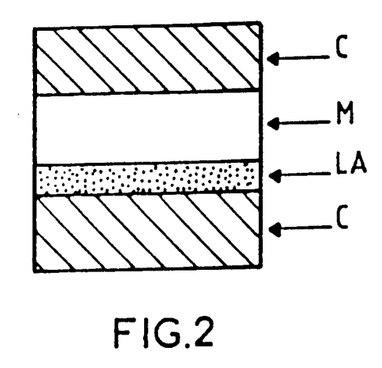
FIG. 2 shows a multi-layer material according to the invention: C/M/LA/C in which M identifies a metal which is electrodeposited or chemically deposited on C.

FIG. 2 illustrates the multi-layer material C/M/LA/C.

Figure 3:
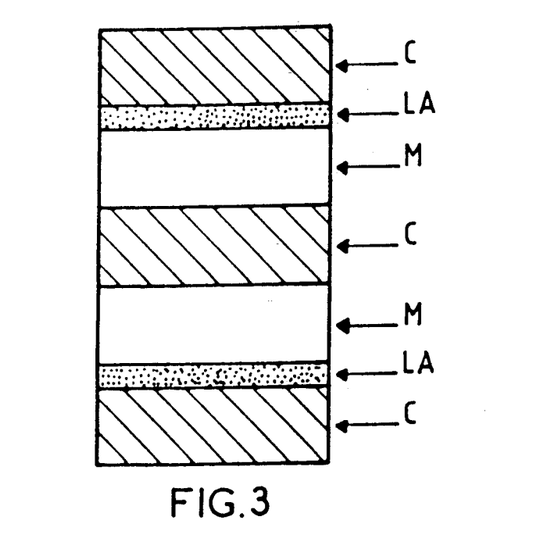
FIG. 3 shows a multi-layer material according to the invention: C/LA/M/C/M/LA/C.

FIG. 3 illustrates the multi-layer material C/LA/M/C/M/LA/C.

The multi-layer materials according to the invention occur in the form of a strip which is wound in a roll or in the form of stackable formats, depending on the final use and depending on the flexibility of the multi-layer material. For the majority of uses envisaged, the multi-layer material in strip or format form will be subjected to a further cutting operation. In the case of electromagnetic shielding for enclosures or rooms however the multi-layer material may be used as it is by juxtaposing successive strips as if it were wallpaper.

In order to facilitate the work to be done by the user, it is important for the multi-layer material to be provided with means which permit positioning thereof or fixing thereof to the support chosen by the final user. With that aim in mind the multi-layer material of the invention may have an external layer of adhesive for permitting fixing thereof to the usual materials: plastics materials, glass, metal, wood, plaster, paper, etc. . . . , and in that case, the multi-layer material of the invention may be in the form of a commercially available adhesive strip.

The adhesive may be of the "hot-melt" type and in that case the multi-layer material, for example in the form of formats or sheets, which does not stick at ambient temperature, can be applied to the support chosen by the user, for example by means of an ironing iron.

Another mode of procedure involves depositing an external layer of adhesive which is active at ambient temperature and covering it with a peelable film in such a way that it can be wound in the form of a roll if it is in strip form, or it can be stacked if it is in the form of formats or sheets, without involving any problem in regard to sticking thereof when removing it from the roll or from the stack. Paper or a plastics material can be used as the material of the peelable film.

Figure 8:
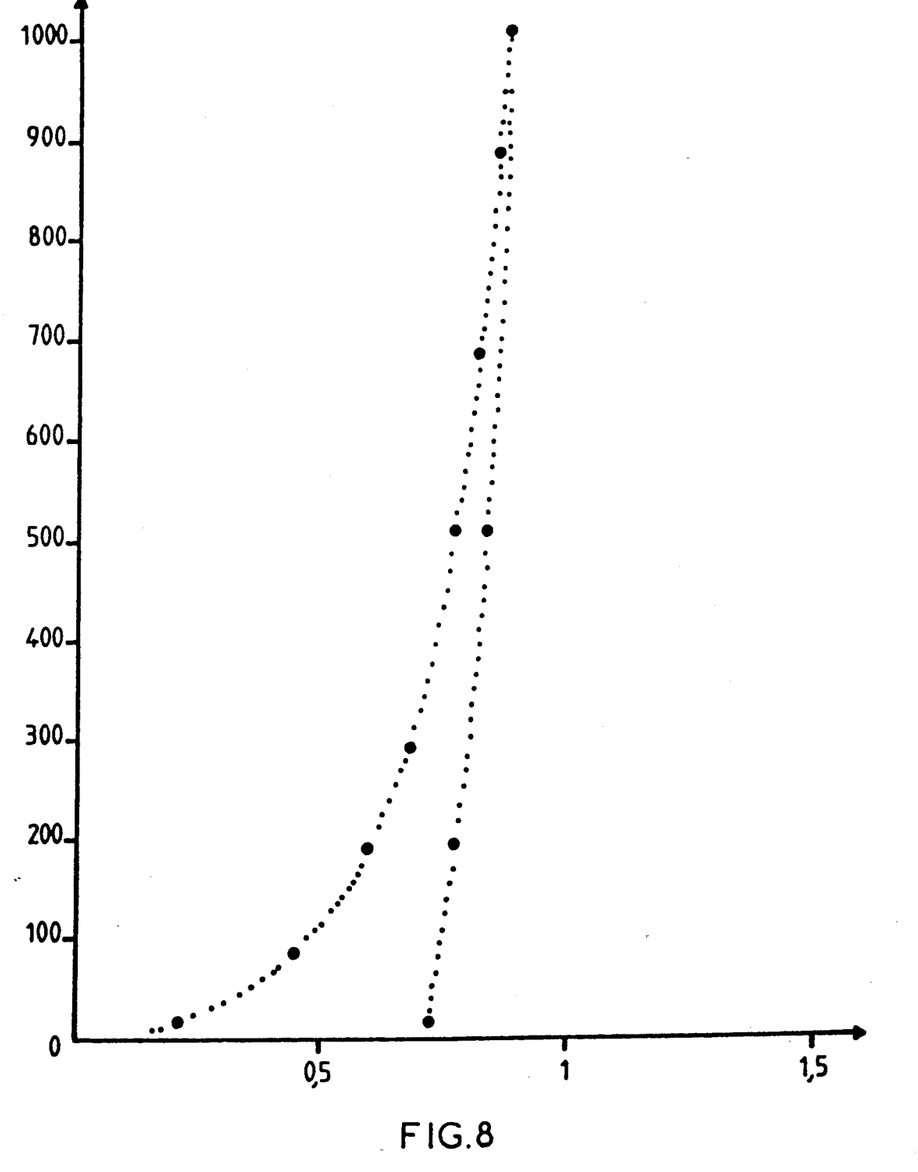
FIG. 8 shows the characteristic curve of a joint (large diameter=149 mm, small diameter - 129 mm, thickness=1.5 mm) produced from the multi-layer material of Example 1 (C/LA/M/C/M/LA/C); the abscissae show the degree of crushing in mm while the ordinates show the clamping pressure in daN/cm$^2$ (or bar=10$^5$Pa)

The multi-layer materials according to the invention make it possible to provide sealing members which exhibit excellent resistance to crushing. Reference may be made for example to the crushing curve (FIG. 8) of a joint obtained with the material prepared in Example 1.

The materials according to the invention are particularly well suited to the production of electromagnetic shielding joints which are used for example at the locations of discontinuities such as the opening systems or the display screens. They can also be used for covering the walls of a room when it is to be converted into a Faraday cage.

The materials according to the invention are particularly suitable for the manufacture of heat sinks formed for example by a format or sheet of flexible multi-layer material of type M/C/M or LM/M/C/M/LM, to the two faces of which two ceramic boards to be cooled are applied or brazed.

A second object of the invention is a process for the economic production of multi-layer material, whether it is in the form of a strip or a format or sheet.

According to the invention the metal M is deposited on at least one face of a layer of flexible material C which is generally in strip form.

That deposit operation can be effected by electrodeposit: a layer of metal M is deposited on the electrically conductive flexible material C which serves as a cathode by the electrolytic reduction of a soluble salt of that metal M which is contained in the bath: in the case of nickel deposit, it is possible to use nickel sulphamate but other salts are equally suitable. That deposit procedure is known per se and is described in "Techniques de l'ingenieur" - M 1610. It is thus possible to produce the products C/M and M/C/M depending on whether a deposit was formed on one or both faces of the layer of flexible material C.

The current densities applied may vary within a wide range and affect the speed of deposit of the metal. The treatment time is selected in such a way as to produce the required thickness of metal.

It is also possible to produce the deposit of metal by a chemical procedure. In that case, reduction of the cation of the metal to be deposited is effected by a chemical reducing agent. When depositing nickel, the most widely used reducing agents are hypophosphite, compounds of boron, hydrazine or salts thereof.

Those deposits, by an electrodeposit process or by a chemical procedure, are preferably produced on a strip of flexible graphite (material C) of a width which can exceed 1 m and with automatic monitoring and regulation of the chemical and/or electrical parameters of the bath as well as the speed of movement of the strip so as to produce a layer of metal M of regular and predetermined thickness.

In order to produce multi-layer materials which are better suited to their final use, at least one face of the multi-layer materials M/C or M/C/M may be covered with bonding metal LM. For that purpose the bonding metal LM may be deposited by an electrodeposit process in a bath containing a soluble salt of the metal LM, as described in "Techniques de l'ingenieur" - M 1620 and 2020, in the case of tin.

It is also possible to produce a deposit by a chemical procedure, in particular when using tin. Whether the deposit of metal LM is produced chemically or electrochemically, it is advantageous, as in the case of depositing the metal M, for it to be produced continuously with automatic monitoring of the bath, and on strips of a great width which can exceed 1 m. The baths for the electrolytic deposit or chemical deposit of metal M and metal LM may advantageously be disposed in series.

It is thus possible to produce the following multi-layer materials: C/M/LM, LM/C/M, LM/C/M/LM, LM/M/C/M, LM/M/C/M/LM.

There are other procedures for depositing metal M or LM which can be used for carrying the invention into effect, such as immersion in a molten metal bath or deposit by the spraying of liquid metal, by thermal projection, deposits under vacuum or CVD (chemical vapour deposition) but often those procedures do not permit continuous treatment of a strip of great length or they do not make it possible to master the small thicknesses required while in addition they are often more burdensome than the preferred procedures of the invention.

In the case where the bonding effect is produced by adhesive LA, the deposit of the layer of adhesive LA is produced by any known process, for example by coating followed by sticking, so as to produce for example the product C/M/LA/C from a strip of C/M and a strip of C, in a single passage of the strip, thus providing for deposit and assembly of the materials. In the case of a multi-layer material comprising two layers of adhesive LA, a double-face application is produced and the material is assembled by sticking the different parts of the multi-layer material: thus for example C/LA/M/C/M/LA/C is produced in a single passage by application of the adhesive LA to the two faces of M/C/M, followed by sticking in line of a layer of flexible material C on each face.

It is however possible to produce a deposit of adhesive LA without having it followed directly by a sticking phase. In that case the adhesive is of the "hot-melt" type. That situation may occur when the adhesive is applied to a strip continuously and it is necessary to effect assembly and final sticking in format or sheet form, in a discontinuous procedure, for example by virtue of the final thickness of the multi-layer material being excessive.

Preferably the adhesive LA, irrespective of its chemical nature, is deposited continuously and with monitoring and regulation of the deposited thickness. It is possible to deposit a layer of adhesive LA which is continuous in a plane by coating or spraying.

Figure 11A:
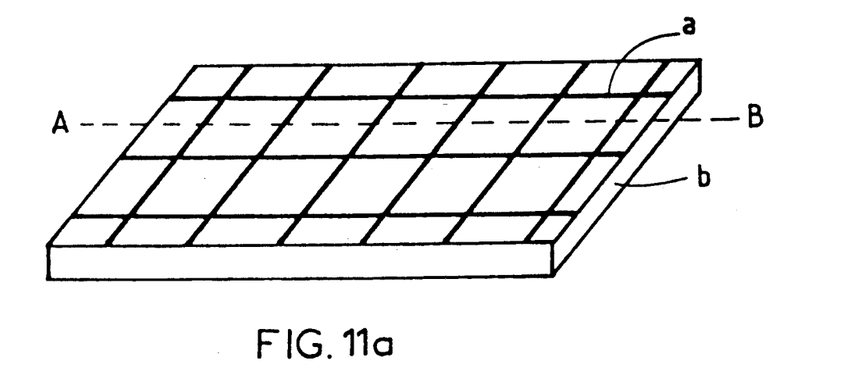
Figure 11B:
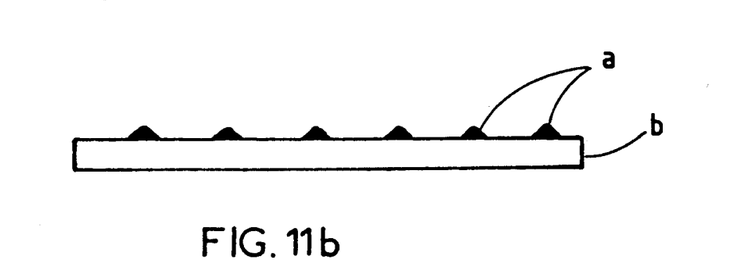

However it may be preferable to have a layer of adhesive which is discontinuous but regularly distributed, typically being in the form of a grid of fine mesh size, each mesh having a side length in the case of a square shape which can be between 0.1 and 10 mm, so as to have a degree of covering of the surface to be covered by the adhesive of between 5 and 50% of said surface; reference may be made to FIG. 11.

That type of discontinuous deposit is typically produced by screen printing. The advantages of a discontinuous deposit with a mesh configuration are as follows: reduction in the weight of adhesive deposited in relation to surface area, which is an attractive consideration both in terms of a saving on expensive material and as a reduction in the risk of pollution by organic materials which are raised to high temperatures, while in addition the fine mesh configuration results in the formation of a very large number of small "dishes", the rim of which is formed by the adhesive LA and which are isolated from each other in such a way that the sealing effect with that type of deposit is superior to that obtained with a deposit of uniform thickness, a preferred linkage path never being excluded in the latter situation.

The multi-layer materials of which at least one face is formed by a bonding layer LM or LA are assembled to at least one layer of flexible material C, sometimes with themselves, in such a way that the bonding layer LM or LA becomes an internal layer, but, with certain types of adhesives LA, the deposit and assembly operations are performed virtually simultaneously, as mentioned hereinbefore. Generally speaking the assembly operation is effected either continuously by passing movement of the materials to be joined together, in the form of a strip, between pressing cylinders, or by a discontinuous procedure using a press from materials to be assembled which have been cut into formats or sheets, with an assembly pressure of between 1 and 100 MPa depending on the assembly procedures used and the materials to be assembled, and with an assembly temperature of lower than 600° C. in the case of a bonding layer of type LM and lower than 300° C. in the case of a bonding layer of type LA.

Discontinuous assembly is effected by means of a press at a temperature which is slightly higher than the melting temperature of the metal LM or the activation temperature of the adhesive LA. For example that temperature is 240° C. when the metal LM is tin which melts at 232° C. The assembly pressure is of the order of 30 MPa.

Continuous assembly is effected by passing the array of layers of the multi-layer material, which are possibly preheated, between two heated cylinders and applying a pressure thereto so as locally to produce substantially the same conditions in respect of temperature and pressure as in the discontinuous assembly process.

Figure 9:
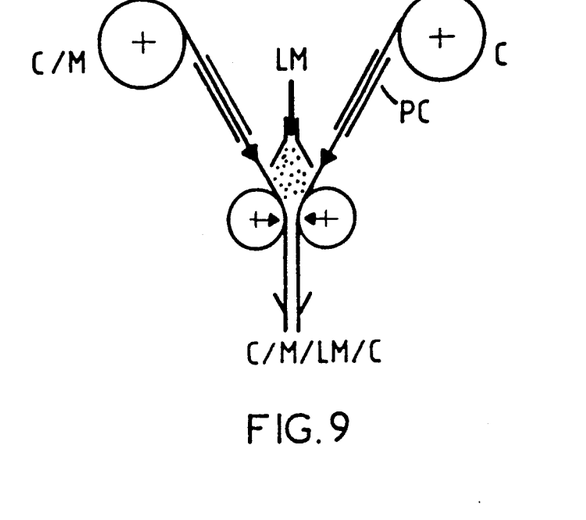
FIG. 9 shows the deposit of metal LM by spraying of liquid metal LM and simultaneous assembly of C and C/M which are preheated in a preheating furnace PC; downstream of the pressure rollers the multi-layer strip C/M/LM/C is cooled (not shown in the diagrammatic view)
Figure 10:
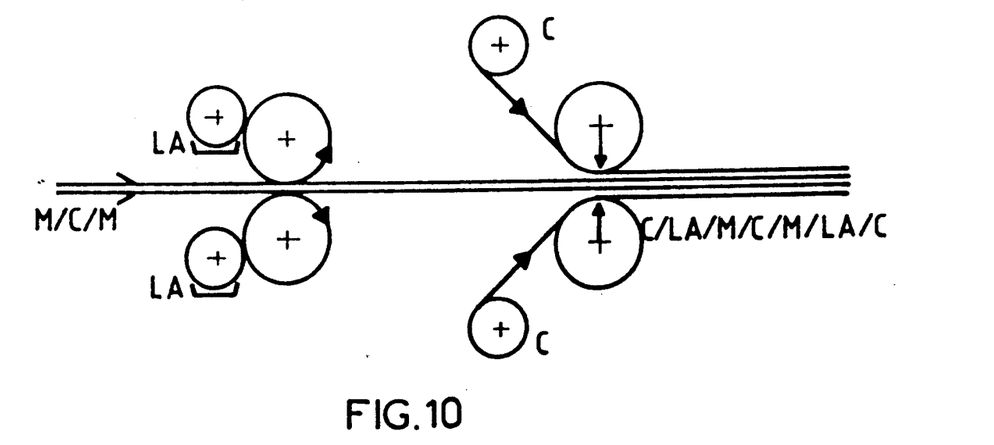
FIG. 10 shows double-face coating with the adhesive LA on M/C/M followed by sticking onto each face of C so as to produce the multi-layer material C/LA/M/C/M/LA/C.

In the case of a bonding metal LM, it is also possible according to the invention simultaneously to provide for the deposit of metal LM and assembly of the various layers by spraying molten liquid metal between the layers to be assembled, which have been preheated beforehand, that operation being followed by cooling of the assembly; see FIG. 9.

Generally speaking, the thickness of the multi-layer material varies little as a result of the compression effect insofar as the pressure applied is not greater than that to which the flexible material C has already been subjected.

In the case of multi-layer materials produced in accordance with the invention and comprising on one of the two faces an adhesive which is intended to facilitate, from the point of view of the final user, the operation of positioning the multi-layer material or the joint or seal produced from that material, it is advantageous, as in the case of the deposit of adhesive LA, to deposit a layer of the adhesive, which is discontinuous but regularly distributed, preferably by means of a screen printing process, which makes it possible to produce a deposit in the form of a grid of fine mesh size, so as to provide a degree of covering of the surface to be covered of between 5 and 50% thereof.

In addition to the advantages already mentioned above, in regard to the deposit of adhesive LA by means of the same procedure, that process has the advantage of not electrically insulating the subjacent layer, which is an attractive consideration in regard to the electromagnetic screening use. In addition when the external layer of adhesive is covered by a peelable film, a film of small thickness can be used without being torn when peeled off.

The process according to the invention has many advantages, in particular:

it permits metal M to be deposited directly on the layer of flexible material C, which makes it possible to eliminate a bonding layer, in particular an adhesive-based bonding layer, which is a favourable consideration in regard to many uses;

the direct deposit of metal M on the layer of flexible material C permits the material to adapt to and closely match the micro-roughness of the surface of the flexible material C, which contributes to excellent adhesion between those two layers, hence affording the possibility of handling the multi-layer material and the final joint or seal without the risk of causing damage thereto;

the deposit of metal LM makes it possible to produce a multi-layer material without any adhesive, which opens new areas of use in particular when the sealing members are to be used at high temperature and under conditions of non-contamination, for example in the electronic industry. In addition, with that type of joint, the risk of creep is totally eliminated;

the procedures used for deposit of the metal M make it possible to provide as desired and in accordance with requirements a multi-layer material with the optimum thickness of metal M and of uniform thickness whereas the prior art requires stocks of strips of metal of different thicknesses to be kept;

finally the process according to the invention permits a high degree of productivity since:

the different phases of the process can be carried out continuously and over a great width which is at least equal to 1 m whereas electroformed nickel strips are available in a width not exceeding 50 cm;

all of the phases of the process can be carried out in a line and in a single passage of the different layers of material; and the different phases of the process can be easily automated and regulated, thus permitting easy quality control.

To sum up, the invention permits the flexible and economic manufacture of multi-layer materials which are versatile in terms of their use, whether they are materials for fluid-tight seals, whether they are for providing a sealing effect in relation to electromagnetic waves or whether the situation involves promoting heat transfer effects. These materials can also meet severe requirements and in particular requirements in respect of non-contamination at medium to elevated temperatures.

DESCRIPTION OF THE DRAWINGS

FIG. 11a diagrammatically illustrates a deposit of adhesive (a) in the form of a grid using a screen printing process on a support (b), while FIG. 11b is a view in section taken along line AB in FIG. 11a.

EXAMPLES

Example 1

In a nickel sulphamate nickel-plating bath, a 10 μm layer of nickel was deposited on each face of a sheet of flexible graphite (Papyex - registered trademark) of a thickness of 0.5 mm. Each face of the sheet when nickel-plated in that way was coated with an epoxy resin-based adhesive, to which a sheet of flexible graphite 0.5 mm in thickness was applied (see FIG. 3). That resulted in a material which was 1.5 mm in thickness. The crushing tests under a load of 100 MPa as well as the sealing tests in respect of a joint or seal produced with that material are excellent (see FIG. 8).

Example 2

A sheet of flexible graphite measuring 0.5 mm in thickness was nickel-plated over one face to a thickness of 10 μm as in Example 1 and then the nickel-plated face was plated with a thickness of 1 μm of tin. A second sheet of 0.5 mm flexible graphite was assembled to the preceding sheet (tin side) in the hot condition at 240° C. and under a pressure of 30 MPa. After cooling, the result obtained was a material measuring 1 mm in thickness (see FIG. 6). The crushing tests in respect of a seal produced with that material are excellent under a loading of 100 MPa.

Example 3

Figure 5:
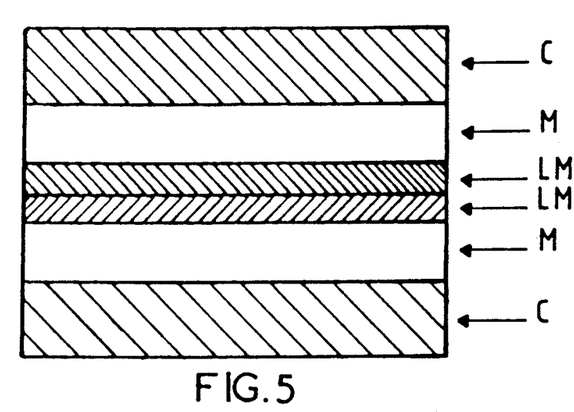
FIG. 5 shows a multi-layer material according to the invention: C/M/LM/M/C produced from C/M/LM.

Two sheets of flexible graphite measuring 0.5 mm in thickness were nickel-plated, each on one face to a thickness of 5 μm, then each nickel-plated face was plated with a thickness of 1 μm of tin. Those two sheets were then pressed together under 30 MPa at a temperature of 240° C., with the plated faces being in contact with each other. After cooling the result is a multi-layer material measuring 1 mm in thickness, of the structure C/M/ML/M/C; see FIG. 5.

Example 4

A sheet of flexible graphite measuring 0.5 mm in thickness was nickel-plated to a thickness of 5 μm and then tin-plated to a thickness of 1 μm on its two faces. Two sheets of flexible graphite measuring 0.5 mm in thickness were applied on respective sides of the nickel-plated and tin-plated graphite sheet. Those three sheets were pressed under a loading of 30 MPa at 240° C. After cooling the result obtained was a multi-layer material of a thickness of 1.5 mm; see FIG. 7. The crushing tests under a loading of 100 MPa in respect of joints produced with the materials of Examples 3 and 4 gave excellent results.

Example 5

A sheet of flexible graphite measuring 0.2 mm in thickness was nickel-plated to different thicknesses on one face. The resistance R☐ of the material was then measured (resistance in a direction parallel to the sheet of a square with a side length of 50 μm):

| Test No. | Thickness Ni (μm) | R(mΩ) |
| --- | --- | --- |
| 5-1 | 5 | 13.5 |
| 5-2 | 10 | 7.3 |
| 5-3 | 15 | 5.0 |

Those materials are suitable for electromagnetic shielding and as a heat sink.

Example 6

This Example only differs from Example 5 in that the sheet of flexible material is 0.5 mm in thickness instead of 0.2 mm.

| Test No. | Thickness Ni (μm) | R(mΩ) |
| --- | --- | --- |
| 6-1 | 5 | 12.0 |
| 6-2 | 10 | 6.8 |
| 6-3 | 15 | 4.3 |

Those materials are suitable for electromagnetic shielding and as a heat sink.

Example 7

A sheet of flexible graphite measuring 0.2 mm in thickness was copper-plated to different thicknesses on one face and then the resistance was measured as in Example 5.

| Test No. | Thickness Cu (μm) | R(mΩ) |
| --- | --- | --- |
| 7-1 | 2 | 49.0 |
| 7-2 | 5 | 3.3 |
| 7-3 | 7 | 2.3 |

These materials are suitable for electromagnetic shielding and as a heat sink.

Example 8

Example 8 differs from Example 7 only in regard to the thickness of the sheet of graphite of 0.5 mm instead of 0.2 mm in Example 7.

| Test No. | Thickness Cu (μm) | R(m) |
| --- | --- | --- |
| 8-1 | 2 | 21.0 |
| 8-2 | 5 | 4.5 |
| 8-3 | 7 | 2.3 |

These materials are suitable for electromagnetic shielding and as a heat sink.

We claim:

1. A multi-layer material comprising at least two layers of flexible material, including one said layer designated "C" of electrically conductive expanded recompressed graphite and another said layer of metal and designated "M", wherein the layer of material C has at least one face thereof covered in its entirety by a layer of metal M and is in direct electrical contact with said layer of metal M, and wherein said layer of metal M is obtained by electrodeposition or by chemical deposit of at least one metal M directly onto the face of said layer of material C in such a way that the metal M adheres directly to the face of the layer of material C and closely matches the face in micro-relief.

2. A multi-layer material according to claim 1 wherein said flexible material C is flexible graphite of a specific gravity of between 0.3 and 1.5 in a layer of a thickness of between 0.1 and 10 mm.

3. A multi-layer material according to claim 2 wherein the thickness of the layer of metal deposited is between 1 and 200 μm.

4. A multi-layer material according to claim 3 wherein the metal M is nickel or copper.

5. A multi-layer material according to claim 3 wherein the thickness of the layer of metal deposited is between 3 and 50 μm.

6. A multi-layer material according to claim 1 wherein at least one face thereof is covered with a bonding layer L so as to enable fixation of said face to another layer either of metal M or of flexible material C.

7. A multi-layer material according to claim 6 wherein the bonding layer L is of a thickness of between 1 and 10 μm.

8. A multi-layer material according to claim 7 wherein said bonding layer L is formed by a metal LM having a melting point lower than that of the metal M serving as a reinforcement, which is deposited on at least one face of a multi-layer material C/M or M/C/M, so as to produce a multi-layer material designated: C/M/LM, LM/C/M, LM/C/M/LM, LM/M/C/M, or LM/M/C/M/LM.

9. A multi-layer material according to claim 8 wherein at least one bonding layer LM is covered by a layer of flexible material C so as to produce directly or after assembly a multi-layer material designated: C/M/LM/C, C/LM/C/M, C/LM/C/M/LM/C, C/LM/M/C/M, C/LM/M/C/M/LM/C, C/M/LM/M/C, C/M/LM/C/LM/M/C, C/M/LM/C/M/LM/C, C/LM/C/M/LM, or C/LM/M/C/LM.

10. A multi-layer material according to claim 8 wherein the bonding metal LM is tin.

11. A multi-layer material according to claim 7 wherein said bonding layer L is a layer of resinous adhesive LA capable of causing adhesion of the layer of metal M and the layer of flexible material C, covering at least one face of a multi-layer material C/M or M/C/M so as to produce a multi-layer material designated: LA/C/M, C/M/LA, LA/C/M/LA, LA/M/C/M, or LA/M/C/M/LA.

12. A multi-layer material according to claim 11 wherein each bonding layer LA is covered by a layer of flexible material C so as to produce directly or by assembly a multi-layer material designated: C/LA/C/M, C/M/LA/C, C/LA/C/M/LA/C, C/LA/M/C/M, or C/LA/M/C/M/LA/C.

13. A multi-layer material according to claim 11 wherein the adhesive LA is based on phenol, epoxy, polyimide, acrylic or polyurethane resin.

14. A multi-layer material according to claim 1 of which one face is covered by an external layer of hot melt adhesive of a thickness of between 1 and 10 μm, for securing said multi-layer material to a final support.

15. A multi-layer material according to claim 14 wherein said external layer of adhesive is covered with a peelable film of material which is non-adhesive in itself.

16. A multi-layer material according to claim 15 wherein said peelable film of material is a paper or plastics film.

* * * * *